(12) United States Patent
Hsieh

(10) Patent No.: US 7,503,815 B2
(45) Date of Patent: Mar. 17, 2009

(54) IC SOCKET WITH TERMINAL

(75) Inventor: Fu-Pin Hsieh, Tu-Cheng (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 11/821,236

(22) Filed: Jun. 22, 2007

(65) Prior Publication Data

US 2008/0007923 A1  Jan. 10, 2008

(30) Foreign Application Priority Data

Jun. 23, 2006 (CN) .................. 200620074429.6

(51) Int. Cl.
*H01R 4/48* (2006.01)

(52) U.S. Cl. ..................................... 439/862

(58) Field of Classification Search ............ 439/862, 439/733.1, 70, 71
See application file for complete search history.

(56) References Cited

U.S. PATENT DOCUMENTS

| 6,113,440 | A  | * | 9/2000 | Fijten et al. ............... 439/862 |
| 6,905,377 | B2 | * | 6/2005 | Murr ........................ 439/862 |
| 6,955,572 | B1 | * | 10/2005 | Howell ..................... 439/862 |
| 6,976,888 | B2 | * | 12/2005 | Shirai et al. ............... 439/862 |
| 7,247,062 | B1 | * | 7/2007 | Polnyi et al. .............. 439/862 |

* cited by examiner

*Primary Examiner*—Jean F Duverne
(74) *Attorney, Agent, or Firm*—Wei Te Chung

(57) ABSTRACT

A terminal (1) for an IC socket includes a mounting end (11) adapted to be mounted onto a substrate. The mounting end includes a bottom surface (110) and a side surface (113). A recess (111), on a first region of the bottom surface, is adapted for a body of reflowable, electrically conductive material to be fused thereon. A channel (112), on a second region of said bottom surface, extends from the side surface to the recess. The providence of the channel allows the vapored flux material to be laterally dissipated through the channel, thereby having no formation of one or more voids within the mass of reflowable, electrically conductive material, during the reflowable process.

13 Claims, 5 Drawing Sheets

IC SOCKET WITH TERMINAL

BACKGROUND OF THE INVENTION

1. Field of the Invention

The present invention relates to the art of electrical connectors, and more particularly to a terminal for an IC socket, wherein the terminal is adapted for a mass of electrically conductive material to be attached thereto.

2. Description of the Related Art

A conventional terminal 1' for an IC socket is shown in FIG. 5 to include a mounting end 11', which is adapted to be mounted onto a substrate. The mounting end 11' defines a recess 111' on a bottom surface 110' thereof. The recess 111' is shaped and dimensioned to receive a mass of electrically conductive material (not shown), being generally of a solder ball. A layer of flux material (not shown) is then applied onto the bottom surface 110' including the recess 111' to assist in the attachment of the mass of electrically conductive material onto the recess 111' of the mounting end 11', before the mass of electrically conductive material is fused onto the mounting end 110' through a reflowable process. The reflowable process is utilized to lead the mass of electrically conductive material to be melted and fused onto the mounting end 110', while causing the layer of flux material to be vapored. A situation often occurs that the melted mass of conductive material may wrap the vapored flux material during the reflowable process. Thus, one or more voids may be formed within the mass of electrically conductive material, which is undesirable to the manufacturing of the IC socket.

SUMMARY OF THE INVENTION

A terminal for an IC socket according to a preferred embodiment includes a mounting end adapted to be mounted onto a substrate. The mounting end includes a bottom surface and a side surface. A recess is defined on a first region of the bottom surface. The recess is adapted for a body of reflowable, electrically conductive material to be fused thereon. A channel is defined on a second region of said bottom surface, and is arranged extending from the side surface to the recess, wherein the second region is different from the first region of the bottom surface. Thus, the providence of the channel allows the vapored flux material to be laterally dissipated through the channel, thereby having no formation of one or more voids within the mass of reflowable, electrically conductive material, during the reflowable process.

Other features and advantages of the present invention will become more apparent to those skilled in the art upon examination of the following drawings and detailed description of preferred embodiments, in which:

DETAILED DESCRIPTION OF PREFERRED EMBODIMENT

Figure 1:
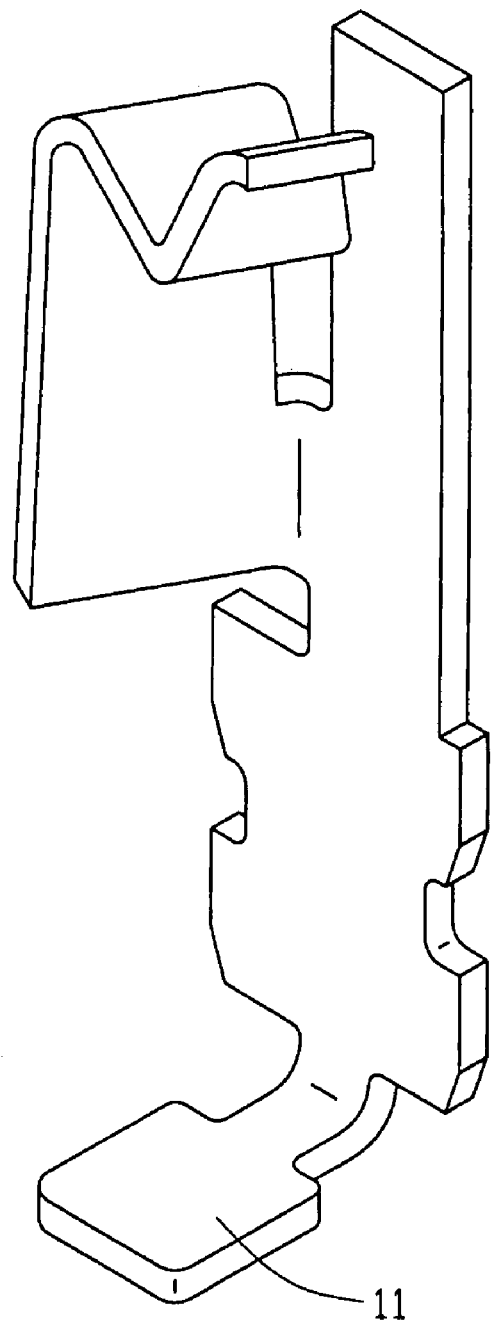
FIG. 1 is a perspective view of a terminal for an IC socket according to a preferred embodiment of the present invention.
Figure 2:
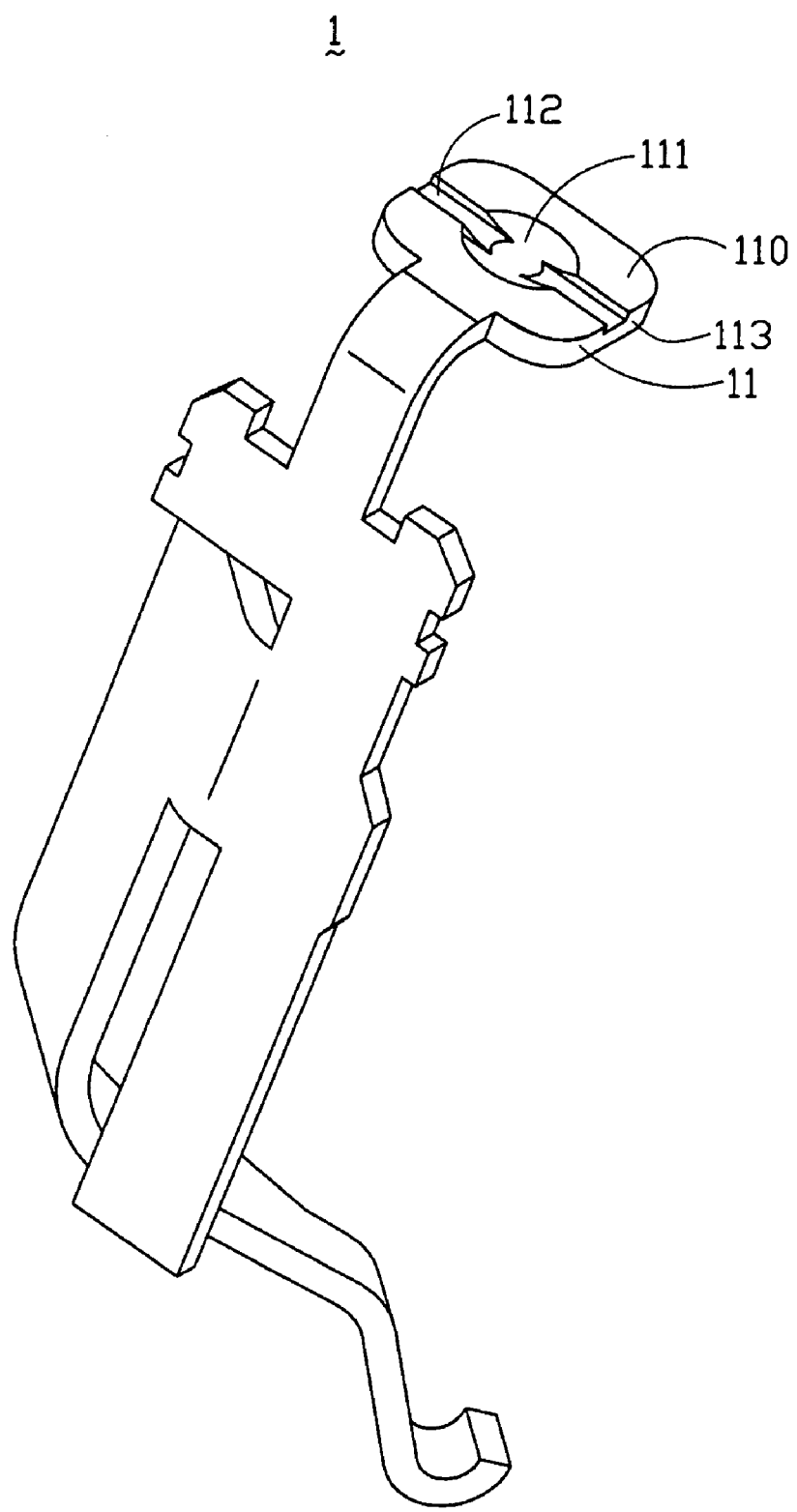
FIG. 2 is another perspective view of the terminal of the IC socket of FIG. 1.
Figure 3:
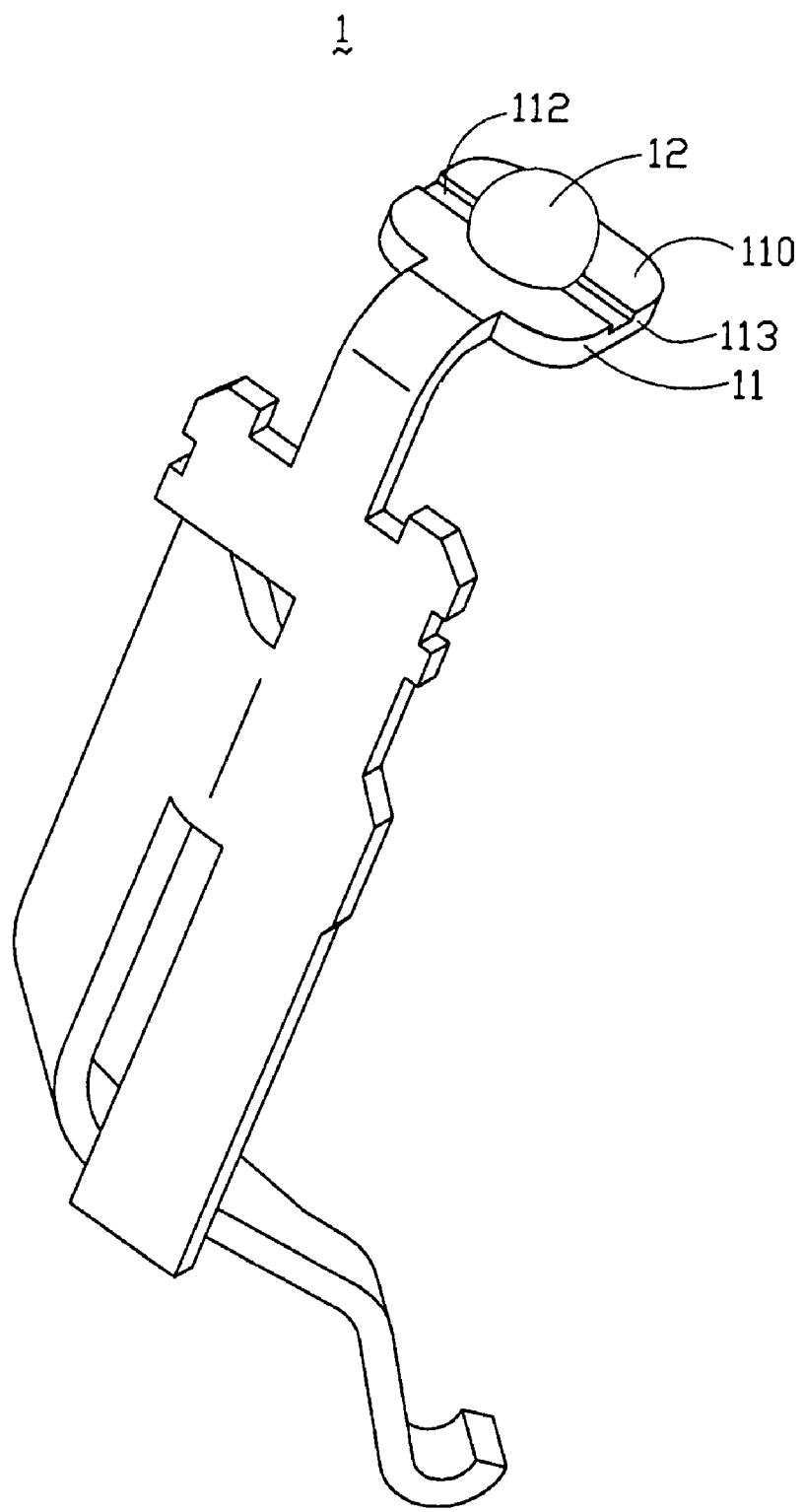
FIG. 3 is a perspective view of the terminal of FIG. 2, but showing a mass of heat fusible material attached thereto.
Figure 4:
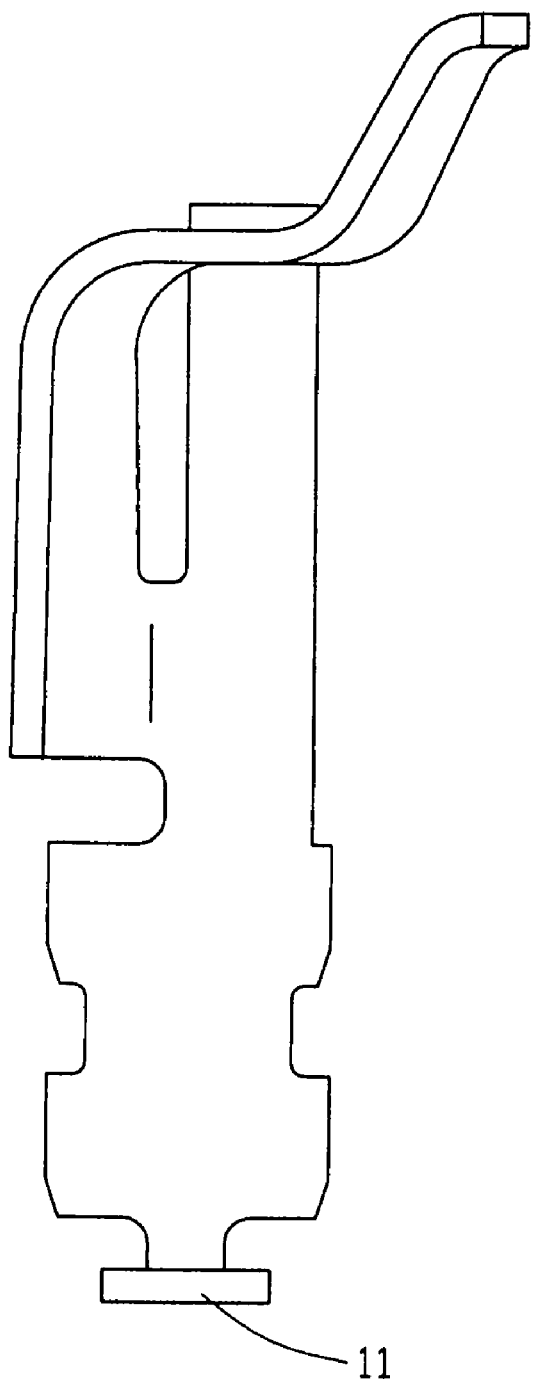
FIG. 4 is a front view of the terminal of FIG. 1.
Figure 5:
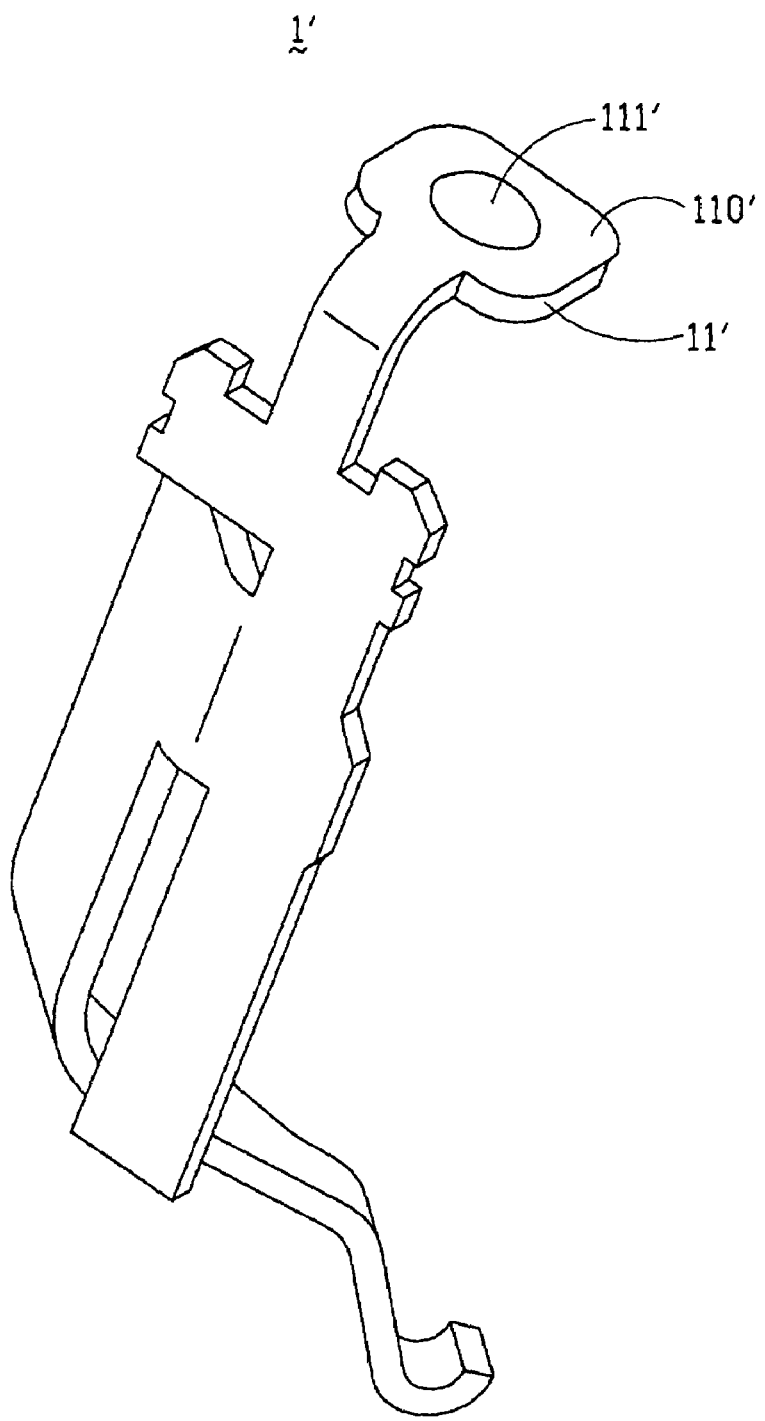
FIG. 5 is a perspective view of a conventional terminal.

Referring to FIGS. 1 to 4, a terminal 1 for an IC socket is shown in accordance with the preferred embodiment of the present invention to include a mounting end 11 adapted to be mounted onto a substrate (not shown).

The mounting end 11 of the terminal 1 includes a bottom surface 110, and a side surface 113 transverse to the bottom surface 110, wherein both of the side surface 113 and the bottom surface 110 are exposed to the exterior. A mounting recessed region 111 is defined on a middle portion of the bottom surface 110. The mounting recessed region 111 is adapted for a body or mass of reflowable, electrically conductive material (12) to be fused thereon. A channel or slot 112 is defined on another region of the bottom surface 110 except for the mounting recessed region 111, and is arranged extending from the side surface 113 to the recessed region 111. The providence of the channel 112 allows the vapored flux material (not visually seen) to be laterally dissipated through the channel, thereby having no formation of one or more voids within the mass of reflowable, electrically conductive material, during the reflowable process. It should be noted that, the channel 112 may be terminated at any surface region, which is exposed to the exterior, other than the side surface 113 of this preferred embodiment.

While the present invention has been described with reference to preferred embodiments, the description of the invention is illustrative and is not to be construed as limiting the invention. Various of modifications to the present invention can be made to preferred embodiments by those skilled in the art without departing from the true spirit and scope of the invention as defined by the appended claims.

What is claimed is:

1. An IC socket comprising:
    a terminal having a mounting portion, the mounting portion adapted to be mounted onto a substrate;
    the mounting end having a bottom surface;
    a recess defined around a first region of said bottom surface and adapted for a mass of heat fusible material to be fused thereon; and
    a slot extending from a second region different from the first region to be laterally communicative with the recess, the slot having a depth less than a maximum depth of said recess; wherein said recess is located in a center area of the bottom surface while the slot is located in an area of said bottom surface beside said center area; wherein the recess is of a circle configuration while the slot is of an elongated configuration, with the slot extending radially with regard to the recess.

2. The terminal as claimed in claim 1, wherein the slot is configured to laterally invade a portion of the center region but not reaching a center of the center region.

3. The terminal as claimed in claim 1, wherein the mounting portion defines a side surface region transverse to the bottom surface, the slot extending from the side surface region.

4. An IC socket comprising:
    a terminal including a mounting section, the mounting section disposed adjacent a substrate;
    the mounting section having a bottom surface defining a center region and a periphery region neighboring to the center region; recess defined on the center region and adapted for a mass of heat fusible material to be fused thereon; and
    a channel extending from the periphery region and terminated at a portion of the center region but not reaching a center of the center region; wherein the mounting portion defines a side surface region transverse to the bottom surface, the slot extending from the side surface region; wherein the recess is of a circle configuration while the slot is of an elongated configuration, with the slot extending radially with regard to the recess.

5. The terminal as claimed in claim 4, wherein the slot has a depth less than a maximum depth of said recess.

6. A terminal assembly for an IC socket, the terminal comprising:

a horizontally mounting end configured to be mounted onto a substrate;

the mounting end having a horizontal downward undersurface defining a first region and a second region communicatively neighboring to the first region, wherein a first structure is formed in the first region where a body of reflowable, electrically conductive material is fused thereon, and a second structure, which laterally and horizontally communicates with the first structure, is formed in the second region through which flux material vapor is allowed to escape laterally; wherein the first structure is an arc like cavity and the second structure is a slot both upwardly recessed from the undersurface; wherein the first structure defines a circular configuration while the second structure defines an elongated configuration; wherein the mounting end further defines a side surface adjacent to said undersurface, and the second structure communicates with said side surface through which said flux material vapor escapes laterally.

7. The terminal as claimed in claim 6, wherein said second structure extends radially with regard to the first structure.

8. The terminal assembly as claimed in claim 6, wherein the mounting end further defines a side surface adjacent to said undersurface, and the second structure communicates with said side surface through which said flux material vapor escapes laterally.

9. The terminal assembly as claimed in claim 6, wherein the first region is located in a center portion of the mounting end while the second region is located in a periphery portion of the mounting end.

10. The terminal assembly as claimed in claim 6, wherein the second structure extends linearly.

11. The terminal assembly as claimed in claim 6, wherein the first region is located in a center portion of the mounting end while the second region is located in a periphery portion of the mounting end.

12. The terminal assembly as claimed in claim 6, wherein the second structure extends linearly.

13. The terminal assembly as claimed in claim 6, wherein the first structure is an arc like cavity and the second structure is a slot both upwardly recessed from the undersurface.

* * * * *